United States Patent [19]

Lauterbach et al.

[11] 4,341,816
[45] Jul. 27, 1982

[54] METHOD FOR ATTACHING DISC- OR PLATE-SHAPED TARGETS TO COOLING PLATES FOR SPUTTERING SYSTEMS

[75] Inventors: Richard Lauterbach, Munich; Hartmut Keller, Poecking, both of Fed. Rep. of Germany

[73] Assignee: Siemens Aktiengesellschaft, Berlin & Munich, Fed. Rep. of Germany

[21] Appl. No.: 168,653

[22] Filed: Jul. 11, 1980

[30] Foreign Application Priority Data

Aug. 21, 1979 [DE] Fed. Rep. of Germany ....... 2933835

[51] Int. Cl.³ .............................................. B05D 1/08
[52] U.S. Cl. ......................................... 427/34; 29/458; 204/298; 228/122; 228/208; 427/423; 204/192 R; 204/192 C
[58] Field of Search .................. 427/34, 423; 228/208, 228/122; 204/192, 298; 29/458

[56] References Cited

U.S. PATENT DOCUMENTS

| | | | |
|---|---|---|---|
| 3,020,182 | 2/1962 | Daniels | 228/122 |
| 3,293,065 | 12/1966 | Roetter | 228/122 |
| 3,703,306 | 11/1972 | LaChance | 228/208 |
| 3,872,577 | 3/1975 | Kugler et al. | 228/208 |
| 3,933,644 | 1/1976 | Skinner et al. | 204/192 R |
| 4,009,090 | 2/1977 | Veigel | 204/298 |
| 4,011,981 | 3/1977 | Danna et al. | 228/208 |
| 4,209,375 | 6/1980 | Gates et al. | 204/192 R |

FOREIGN PATENT DOCUMENTS

| | | | |
|---|---|---|---|
| 2361564 | 6/1975 | Fed. Rep. of Germany | 228/208 |
| 51-107251 | 9/1976 | Japan | 228/208 |
| 1368960 | 10/1974 | United Kingdom | 228/208 |

Primary Examiner—John H. Newsome
Attorney, Agent, or Firm—Hill, Van Santen, Steadman, Chiara & Simpson

[57] ABSTRACT

Disc- or plate-shaped targets for sputtering systems are attached to associated cooling plates by plasma-spraying a surface of such target with a compatible adhesive layer, for example composed of Ni; Ni/Cr mixtures; 80/20 Ni/Al mixtures; Ni/Al/Mo mixtures; Al/bronze mixtures; Mo; W; Al/Si mixtures, Zn, Cu, Cu/glass mixtures, etc., and then coating such adhesive layer with a solderable layer, for example composed of Cu, Cu/glass mixture or Ag, etc., and soldering such solderable layer onto the surface of a cooling plate. Preferably, the adhesive layer and the solderable layer are applied via plasma spraying.

12 Claims, 2 Drawing Figures

METHOD FOR ATTACHING DISC- OR PLATE-SHAPED TARGETS TO COOLING PLATES FOR SPUTTERING SYSTEMS

BACKGROUND OF THE INVENTION

1. Field of the Invention:

The invention relates to sputtering systems and somewhat more particularly to a method of attaching target materials existing in disc- or plate-shaped form onto cooling plates in sputtering systems.

2. Prior Art:

In typical sputtering systems, the material to be atomized is positioned onto, for example, water-cooled plates as a disc- or plate-shaped target body and thereafter impinged by an electron beam. The cooling is required to prevent an undue temperature rise of target material in the sputtering system due to the electron impingement onto such target material during the plasma discharge. In order to achieve a good cooling effect, such cooling plates are generally fabricated out of copper. However, good cooling is only attainable if a good thermal contact exists between the target body and the associated cooling plate.

Targets are known wherein the target material is "bonded" to a cooling plate via soft-solder foils. However, since most target materials are generally unsolderable, soft-solder foils only provide a slight mechanical adhesion so that during usage, target materials so-bonded to cooling plates frequently become loose, either partially or totally.

SUMMARY OF THE INVENTION

The invention provides a method whereby substantially all standard target materials can be attached to cooling plates with adequate adhesive force and with good thermal contact.

In accordance with the principles of the invention, select target materials in the form of a plate or disc-shaped body are attached to cooling plates for sputtering systems by applying a layer of an adhesive material compatible with the select target material onto a surface of the target material, coating such adhesive layer with a solderable layer composed of a material selected from the group consisting of Cu, Cu/glass mixtures of Ag and thereafter soft-soldering the so-applied solderable layer on the target body with a surface of the cooling plate.

In preferred embodiments of the invention, the adhesive layer, an optional intermediate layer and the solderable cover layer are applied onto the disc- or plate-shaped targets via plasma spraying. Either the adhesive layer or the optional intermediate layer function, in addition to an anchoring means, as a diffusion barrier for soft solder. Accordingly, it is important that the thickness of the solderable cover layer be thick enough so that it cannot dissolve due to diffusion into the soft solder.

In certain preferred embodiments of the invention, the surface of the target bodies to be attached to cooling plates are pre-soldered with the use of a suitable soft-solder fluxing agent. The surface of the cooling plates to be attached to the target bodies are similarly pre-soldered before the actual soldering operation. Such pre-treated target bodies can then be soldered to the pre-treated cooling plates, particularly with the assistance of a reflow soldering technique, without employing fluxing agents.

In preferred embodiments of the invention wherein the target material is metallic, the adhesive layer or the optional intermediate layer is composed of a material selected from the group consisting of Ni, Ni/Cr mixtures, 80/20 Ni/Al mixtures, Ni/Al/Mo mixtures, Al/bronze mixtures, Mo, W, Al, Al/Si mixtures, Zn, Cu and Cu/glass mixtures.

In embodiments of the invention wherein the target body is composed of a material selected from the group consisting of glass, ceramic oxides and silicon, the adhesive layer or the optional intermediate layer is composed of a material selected from the group consisting of Al, Al/Si mixtures, Cu, Cu/glass mixtures, Zn, W, Al/bronze mixtures or Mo.

In embodiments of the invention wherein the target body is composed of graphite, the adhesive layer is composed of W and the intermediate layer is composed a material selected from the group of Ni, Ni/Al mixtures, Ni/Al/Mo mixtures, Al/bronze mixtures, Al and Al/Si mixtures.

DESCRIPTION OF THE PREFERRED EMBODIMENTS

Figure 1:
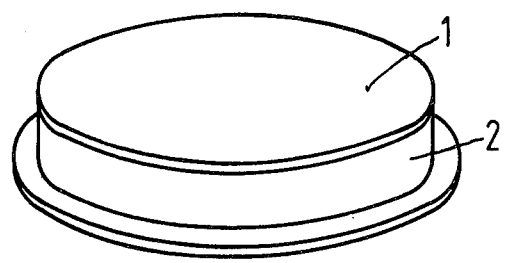
FIG. 1 is a somewhat elevated plan view of a disc-shaped target body attached to a cooling plate via the principles of the invention.

In the practice of the invention, a select target body 1 is coated with an adhesive layer applied via plasma spraying. The adhesive layer is selected so as to be compatible with the material forming target body 1. Thereafter, also by means of plasma spraying, a solderably layer composed of copper, copper/glass mixture or a silver is applied over the adhesive layer in order to make the target body 1 solderable.

In embodiments where metallic target materials are utilized, the disc 1 is first cleansed, as by sandblasting and appropriate cleaning at the connecting surface thereof before application of the adhesive and solderable layers. After application of the adhesive layer and the solderable layer, the target body as well as the cooling plate 2 can be pre-soldered with the use of suitable soft solder fluxing agents. Thereafter, the target body and the cooling plate are cleansed so that any fluxing agent residues are removed. Thereafter, the target body 1 is soldered onto the cooling plate 2 by means of reflow soldering without employment of a fluxing agent.

In embodiments where the target body 1 is composed of non-solderable metallic target materials such as, for example, aluminum, aluminum/silicon, aluminum/tantalum, tantalum, chromium, molybdenum, etc., the adhesive layer is preferably composed of a material selected from the group consisting of nickel, nickel/chromium mixtures, nickel/aluminum mixtures, nickel/aluminum/molybdenum mixtures, aluminum/bronze mixtures, molybdenum, tungsten, aluminum, aluminum/silicon mixtures, zinc, copper and copper/glass mixtures. Of these materials, a preferred adhesive material is a 80/20% nickel/aluminum mixture.

In embodiments where the target body is composed of a material selected from glass, ceramic oxides and silicon, the adhesive layer is preferably composed of a material selected from the group consisting aluminum, aluminum/silicon mixtures and zinc. In embodiments where the target body is composed of graphite, the adhesive layer is composed of tungsten.

In all of the embodiments, the solderable cover layer consists of a material selected from the group consisting of copper, copper/glass mixtures or silver and is preferably applied in a thickness ranging from approximately 30 through 100 μm.

Directly solderable target materials such as, for example, gold, silver, palladium, platinum and hard solders which exhibit a high solubility for soft solders and thus form alloys with soft solders during soldering operations and change their compositions, can also be attached by following the principles of the invention. With these types of target materials, the plasma-sprayed adhesive layer or, an optional intermediate layer, not only provides a particularly good bond but also functions as a diffusion barrier which prevents an alloying of such target material with the soft solder.

In preferred embodiments of the invention, the adhesive layer is preferably composed of a material selected from the group consisting of nickel, nickel/chromium mixtures, nickel/aluminum mixtures, nickel/aluminum/molybdenum mixtures, aluminum/bronze mixtures, molybdenum, tungsten, aluminum, aluminum/silicon mixtures, zinc, copper and copper/glass mixtures. A preferred material for the adhesive layer is a 80/20% nickel/aluminum mixture.

The optional intermediate layer is composed of a material selected from the group set forth above for the adhesive layer and the intermediate layer may be formed of the same material or of a different one of such material, from the material forming the adhesive layer.

The adhesive layer simultaneously acts as a diffusion barrier for soft solder and as a bonding medium. The optional intermediate layer can be plasma-sprayed directly onto the adhesive layer to function as an additional diffusion barrier.

In all embodiments, the solderable cover layer is composed of a material selected from the group consisting of copper, a copper/glass mixture and silver and is plasma-sprayed so as to form a layer having a thickness ranging from approximately 30 through 100 μm.

In the drawings, a target body 1 in the form of a disc composed of any desired target material is illustrated attached to a cooling plate 2 via soldering in accordance with the principles of the invention.

Figure 2:
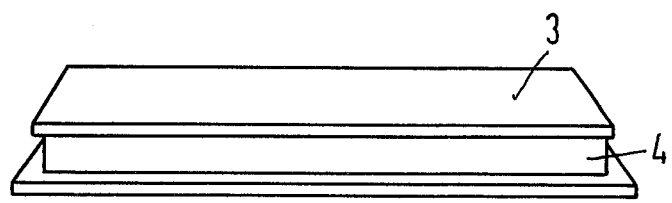
FIG. 2 is a somewhat elevated similar view of a plate-shaped target body attached to a cooling plate via the principles of the invention.

FIG. 2 illustrates a target body 3 in the form of a plate composed of any desired target material attached to a rectangular cooling plate 4 via the principles of the invention.

The relatively large layer thickness of the solderable layer provided in accordance with the principles of the invention assures that such layer material cannot dissolve due to diffusion into the soft solder. Thereby, a thermal overload, up to approximately the melting point of the solder, of the target material during sputtering operation is possible over a relatively long time span without having the solder connection loosen, either entirely or partially.

The foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalence thereof may be resorted to, falling within the scope of the invention as claimed.

We claim as our invention:

1. A method of attaching a body composed of a select target material onto a cooling plate for sputtering systems, comprising:
    applying a layer of an adhesive material compatible with said select target material onto a surface of said body;
    plasma spraying said adhesive layer with a relatively thick solderable layer having a thickness in the range of about 30 to 100 μm and being composed of a material selected from the group consisting of copper, copper/glass mixtures and silver, and
    soft-soldering such coated surface of the body with a surface of a cooling plate.

2. A method as defined in claim 1 wherein said adhesive layer and said solderable layer are applied via plasma spraying.

3. A method as defined in claim 2 wherein an intermediate layer is applied via plasma spraying between said adhesive layer and said solderable layer.

4. A method as defined in claim 1 wherein said body is pre-soldered with a suitable soft solder fluxing agent before application of the adhesive layer and said cooling plate is similarly pre-soldered before the soft-soldering step.

5. A method as defined in claim 1 wherein the coated surface of the body is soldered to the cooling plate via reflow soldering without use of a fluxing agent.

6. A method as defined in claim 1 wherein said select target material is a metal and said adhesive material compatible with such target material is selected from the group consisting of Ni, Ni/Cr mixtures, Ni/Al mixtures, Ni/Al/Mo mixtures, Al/bronze mixtures, Mo, W, Al/Si mixtures, Zn, Cu and Cu/glass mixtures.

7. A method as defined in claim 6 wherein said adhesive material is a 80/20% Ni/Al mixture.

8. A method as defined in claim 6 wherein an intermediate layer is applied between the adhesive layer and the solderable layer and said intermediate layer is composed of a material selected from the group consisting of Ni, Ni/Cr mixtures, Ni/Al mixtures, Ni/Al/Mo mixtures Al/bronze mixtures, Mo, W, Al, Al/Si mixtures, Zn, Cu and Cu/glass mixtures.

9. A method as defined in claim 8 wherein said adhesive layer and said intermediate layer are composed of the same material.

10. A method as defined in claim 8 wherein said adhesive layer and said intermediate layer are composed of different materials selected from said group of materials.

11. A method as defined in claim 1 wherein said select target material is composed of a material selected from the group consisting of glass, ceramic oxides and silicon and said adhesive material is composed of a material selected from the group consisting of Al, Al/Si mixtures, Cu, Cu/glass mixtures, Zn, W, Al/bronze mixtures and Mo.

12. A method as defined in claim 1 wherein said select target material is graphite, said adhesive material is tungsten and an intermediate layer composed of a material selected from the group consisting of Ni, Ni/Al mixtures, Ni/Al/Mo mixtures, Al/bronze mixtures, Al, Al/Si mixtures are applied onto the adhesive layer so as to function as a diffusion barrier and said solderable layer is applied onto said intermediate layer.

* * * * *